United States Patent [19]

Ristic et al.

[11] Patent Number: 5,550,090
[45] Date of Patent: Aug. 27, 1996

[54] METHOD FOR FABRICATING A MONOLITHIC SEMICONDUCTOR DEVICE WITH INTEGRATED SURFACE MICROMACHINED STRUCTURES

[75] Inventors: Ljubisa Ristic, Paradise Valley; Frank A. Shemansky, Jr., Phoenix, both of Ariz.

[73] Assignee: Motorola Inc., Schaumburg, Ill.

[21] Appl. No.: 523,581

[22] Filed: Sep. 5, 1995

[51] Int. Cl.$^6$ ................. H01L 21/461; H01L 21/4757
[52] U.S. Cl. ..................... 437/228; 437/901; 437/921; 216/11
[58] Field of Search ..................... 437/901, 921, 437/927, 228 SEN, 228 H, 228 O; 148/DIG. 159, DIG. 73; 216/11

[56] References Cited

U.S. PATENT DOCUMENTS

| | | |
|---|---|---|
| 5,326,726 | 7/1994 | Tsang et al. . |
| 5,337,606 | 8/1994 | Bennett et al. . |
| 5,343,064 | 8/1994 | Spangler et al. . |
| 5,417,111 | 5/1995 | Sherman et al. . |
| 5,470,797 | 11/1995 | Mastrangelo . |

OTHER PUBLICATIONS

Ristic et al., Motorola, Inc. (Semiconductor Products Sector), "Integration of Surface Micromachined Dynamic Structures".

R. T. Howe et al., Sensors and Actuators, "Polycrystalline and Amorphous Silicon Micromechanical Beams: Annealing and Mechanical Properties", 1983, pp. 447–454.

Putty et al. —R. T. Howe—Robinson et al., Sensors and Actuators, "Process Integration for Active Polysilicon Resonant Microstructures", 1989, pp. 143–151.

Primary Examiner—George Fourson
Assistant Examiner—Scott Kirkpatrick
Attorney, Agent, or Firm—Robert F. Hightower

[57] ABSTRACT

A method for fabricating a monolithic semiconductor device with integrated surface micromachined structures is provided. A semiconductor substrate (10) has an interconnection layer (14) and a first sacrificial layer (16) overlying the substrate (10). Sensor areas (30) and IC areas (40) are formed by patterning the first sacrificial layer (16). A patterned sensor structural layer (32) is formed within sensor area (30) and protected by second sacrificial layer (34) and seal layer (36) while IC elements are formed in IC area (40). Subsequent to IC processing a RTA anneal is performed to relieve stress in sensor layer (32). Sensor area (30) is electrically coupled to IC area (40) and sacrificial layers (16, 34) removed to free sensor elements in sensor areas (40).

21 Claims, 3 Drawing Sheets

METHOD FOR FABRICATING A MONOLITHIC SEMICONDUCTOR DEVICE WITH INTEGRATED SURFACE MICROMACHINED STRUCTURES

BACKGROUND OF THE INVENTION

This invention pertains to semiconductor devices with integrated sensors and more particularly to monolithic semiconductor devices with integrated surface micromachined structures.

Semiconductor devices with integrated sensors are of great interest because of their potential of reduced cost and size in applications requiring the sensing of, for example, acceleration, flow or pressure. For many years, discrete micromachined sensors have been commercially available. These discrete sensors have almost exclusively been fabricated by bulk micromachining techniques, that is the silicon substrate is machined to form the sensing element. While the techniques that have been developed have produced reliable devices, such devices are typically large and not easily integrated with modern semiconductor integrated circuit (IC) device processing. As a result, surface micromachining, that is micromachining of layers deposited on the surface of a substrate, has been the subject of much recent investigation.

Surface micromachining offers the potential of manufacturing much smaller sensors than are possible with bulk micromachining sensor technology. This potential could provide for integrating such sensors with IC devices on a single chip, thus producing a monolithic semiconductor device. Inherent advantages of a monolithic device include improved reliability and lower cost. These integrated devices additionally provide higher sensitivity and accuracy, as well as better compensation of side effects and data acquisition than discrete devices.

A particular problem is that surface micromachined devices have proven to be extremely dependent on the particular processing scheme employed. Often the best process for fabricating the sensor is in direct conflict with that for fabricating the IC device. For example, the high temperature (900 degrees centigrade or higher) IC processes, such as field oxidation or source/drain drive, can create stresses in the relatively thick (1 to 2 micron) polysilicon layers required for surface micromachined structures (SMS's). Such stress accumulation due to multiple high temperature processes can result in deformation of the sensor structure.

Recently, Steven J. Sherman, et al. in U.S. Pat. No. 5,417,111 "MONOLITHIC CHIP CONTAINING INTEGRATED CIRCUITRY AND SUSPENDED MICROSTRUCTURE", issued May 23, 1995, has suggested a solution to this integration problem that include either bipolar circuit elements or metal on silicon (MOS) circuit elements, or circuits that combine both types of elements, BiMOS. Specifically, Sherman et al. propose a process in which the bipolar and/or MOS circuit elements are created before any SMS's thus avoiding the previously mentioned temperature problem. However, this processing sequence imposes limitations to process optimization of the SMS's, such as limiting the ability various layer thickness' or to use thermal anneal and doping cycles to create optimized SMS's, due to the presence of preformed IC circuit elements. The heat of such thermal anneal and doping cycles can degrade the performance of such circuit elements.

Thus it would be beneficial to devise a new process for fabricating monolithic semiconductor devices with integrated surface micromachined structures having both optimized IC and SMS elements.

It is therefore a purpose of the present invention to provide a new process for fabricating monolithic semiconductor devices having both optimized IC and SMS elements.

It is another purpose of the present invention to provide a new process for fabricating monolithic semiconductor devices with integrated surface micromachined structures that provides devices with improved reliability and lower cost.

It is still another purpose of the present invention to provide a new and improved method of fabricating monolithic semiconductor devices with integrated surface micromachined structures that provides devices with higher sensitivity and accuracy as well as better compensation of side effects and data acquisition.

DETAILED DESCRIPTION OF THE DRAWINGS

The present invention involves a novel method of fabricating monolithic semiconductor devices incorporating both surface micromachined sensor structures and the circuitry for processing the signal generated by such sensor structures. For ease of explanation and understanding, the monolithic semiconductor device with an integrated surface micromachined structure of FIG. 1 and subsequent illustrations will depict a surface micromachined cantilever beam. However, it is understood that the invention as illustrated and described may also be employed to make other types of surface micromachined structures such as diaphragms, bridges and trampolines. For example, in U.S. Pat. No. 5,337,606 "LATERALLY SENSITIVE ACCELEROMETER AND METHOD OF MAKING", issued Aug. 16, 1994 and assigned to Motorola, Inc., hereby incorporated by reference, Bennett et al. describe a micromachined capacitor structure that could be fabricated with the method of the present invention.

Figure 1:
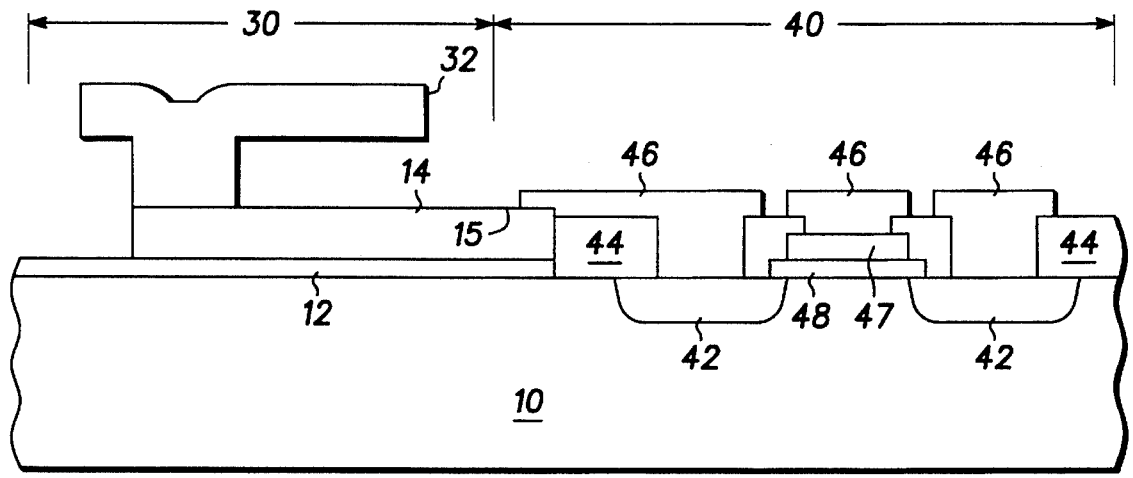
FIG. 1 is a highly simplified cross-sectional view of a portion of a device fabricated using the present invention near the end of the processing.

Referring now to FIG. 1, a highly simplified cross-sectional view of a portion of a device fabricated with an embodiment of the present invention is shown. Semiconductor substrate 10 has a sensor area 30 and an integrated circuit area 40. Within sensor area 30, a polysilicon microstructure or cantilever beam 32 is shown coupled to an underlying interconnection layer 14 which is shown overlying insulating layer 12. Integrated circuit area 40 is illustrated having a highly simplified MOS device comprising source and drain regions 42, oxide layer 44, metal contacts 46, gate electrode 47, and gate oxide layer 48.

While semiconductor substrate 10 is shown with a minimum of detail, it will be understood that substrate 10 is tailored to maximize the yield and performance of semiconductor circuitry formed within integrated circuit area 40. Therefore, substrate 10 can comprise a silicon semiconductor wafer as depicted in FIG. 1, or alternatively substrate 10 can comprise a semiconductor wafer with a layer of epitaxial silicon disposed thereon. In addition, substrate 10 can comprise a silicon bonded wafer structure, or any other structure known to those skilled in the art to be suitable for semiconductor device fabrication. Semiconductor substrate 10 can have any number of doped regions formed therein to accommodate the broad range of semiconductor devices that can be fabricated, including but not limited to simple MOS, complimentary MOS (CMOS), BiMOS and bipolar circuitry. The present invention makes it possible to integrate most types of semiconductor devices with most surface micromachined sensor structures.

Figure 2:
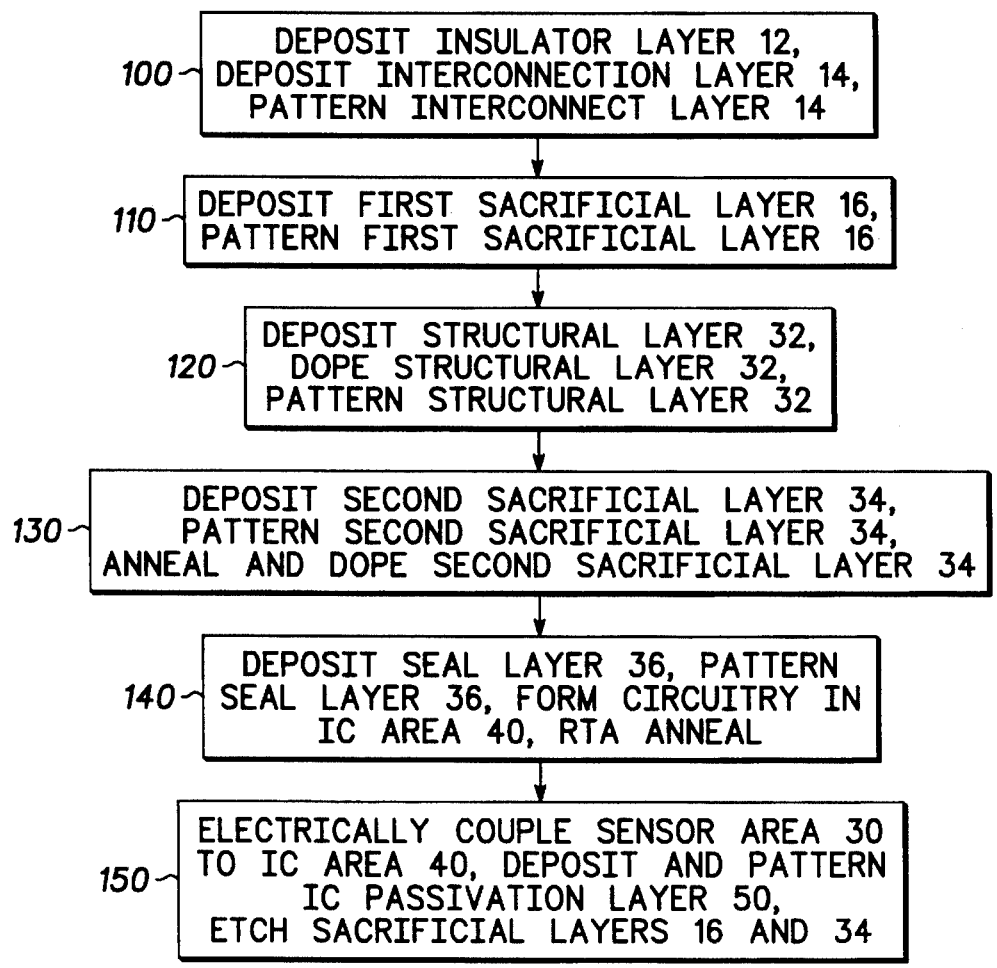
FIG. 2 is a flow chart representing major process steps of an embodiment of the present invention.

FIG. 2 is a flow chart depicting the principal steps of a process which is an embodiment of the present invention. Deposition step 100 comprises the deposition of insulation layer 12 and the deposition and patterning of interconnection layer 14 on substrate 10. Insulation layer 12 is an optional layer, that is, some applications do not require deposition of insulation layer 12. However, most applications benefit by the use of insulation layer 12, as it can serve to both isolate sensor elements from substrate 10, as well as to protect IC area 40 during sensor area 30 processing. To accomplish this dual purpose, layer 12 is typically silicon nitride ($Si_3N_4$) deposited, for example, by low pressure chemical vapor deposition (LPCVD). Alternatively, insulation layer 12 can be a combined layer of silicon dioxide ($SiO_2$) with a $Si_3N_4$ layer disposed thereon.

Interconnection layer 14 serves, at least in part, to electrically couple elements within sensor area 30 to elements within IC area 40. Typically, interconnection layer 14 is fabricated from doped polysilicon, although the commonly used refractory metal silicides or salicides may also be employed. It will be understood that any of the commonly employed techniques for forming doped polysilicon, silicides or salicides may be used to form interconnection layer 14. After formation, interconnection layer 14 is patterned by using standard photolithographic and etch techniques.

Figure 3:
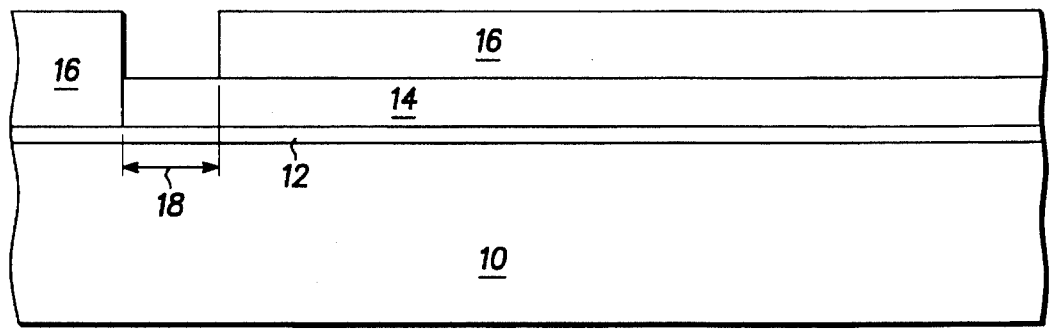
FIGS. 3 to 8 are highly simplified cross-sectional views of portions of a device fabricated using the present invention correlating to the major process steps of FIG. 2.

Step 110 comprises deposition and patterning of first sacrificial layer 16. Layer 16 is typically phosphosilicate glass (PSG) deposited to a thickness of approximately 1 to 2 microns (μ). PSG sacrificial layer 16 can be deposited by any of the commonly employed techniques, for example chemical vapor deposition (CVD). PSG is selected for its fast etch rate and high etch selectivity with respect to polysilicon, the material typically used to form the sensing structures. Referring now to FIG. 3, a highly simplified cross-sectional view of a portion of a monolithic semiconductor device is shown after completion of deposition and patterning step 110 and the removal of any masking layer (not shown). Layer 16 is patterned, via standard photolithographical and etch processes, to define anchor opening 18. Although dry etching techniques can be used to pattern layer 16, typically first sacrificial layer 16 is etched with a buffered oxide etchant (BOE) which is highly selective to underlying interconnection layer 14 shown exposed at the bottom of anchor opening 18.

Turning again to FIG. 2, after removal of the masking layer (not shown), structural layer 32 is deposited, doped and patterned in step 120. Typically, structural layer 32 is formed from polysilicon conformally deposited by, for example LPCVD, to provide complete filling of anchor opening 18 and coupling to interconnection layer 14. While the thickness of structural layer 32 is a function of the type of sensor structural element to be formed, 1 to 2 microns is a typical thickness for a polysilicon cantilever beam as shown.

While polysilicon is typically used to form sensor structural elements, other semiconductive or conductive materials, such as tungsten (W), can also be employed to form sensor elements. However, when polysilicon is employed, the highest deposition rates are obtained when undoped polysilicon is deposited, rather than insitu doped polysilicon. Therefore, an undoped polysilicon film (layer 32) is typically deposited and subsequently doped using one of the several well known, commonly used methods for doping polysilicon, for example ion implantation. After doping, structural layer 32 is patterned to form the particular sensor structural element required. It will also be understood that the doping of structural layer 32 serves, among other things, to enhance electrical coupling of layer 32 to interconnect layer 14 through anchor opening 18.

Figure 4:
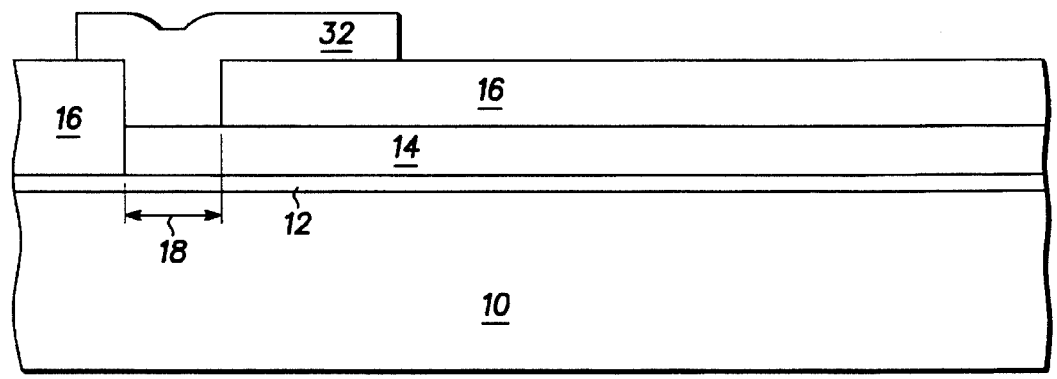

Referring now to FIG. 4, a highly simplified cross-sectional view of a portion of a monolithic semiconductor device is shown after completion of step 120 and the removal of the masking layer (not shown). Structural layer 32 is shown filling anchor opening 18 whereby it is both physically and electrically coupled to interconnect layer 14. Any number of anchor openings 18 can be formed for each sensor element 32, for example if a bridge sensor element is required, two anchor openings 18 would be formed. Further, multiple sensor elements 32 can be formed on a single substrate 10.

Figure 5:
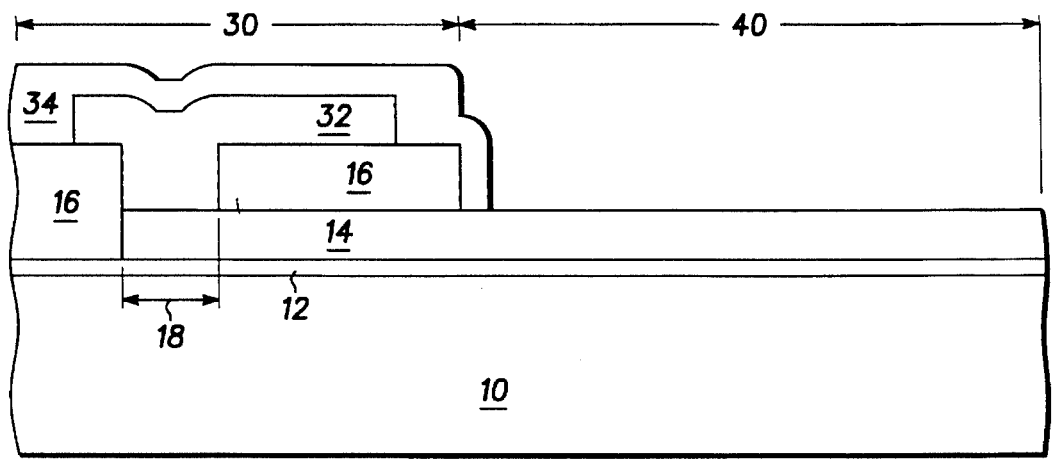

Returning now to FIG. 2, after patterning of structural layer 32, step 130 first provides for deposition and patterning of second sacrificial layer 34 to completely cover patterned structural layer 32. Second sacrificial layer 34 is typically comprised of PSG. Referring to FIG. 5, patterning of layer 34 results in removal of both layer 34 and layer 16 from IC area 40, leaving interconnect layer 14 exposed. Step 130, in FIG. 2, next provides for a thermal anneal. Typically, an anneal temperature of approximately 900 degrees Centigrade is used. This anneal serves both to relieve stress in patterned structural layer 32 and to provide doping of layer 32 by diffusion of phosphorus from both first and second sacrificial layers, 16 and 34 respectively. It has been found that doping patterned layer 32 in this manner is highly effective in that dopant will diffuse from sacrificial layers 16 and 34 into layer 32. Referring now to FIG. 5, layer 32 can be seen to be completely encased between first and second sacrificial layers, 16 and 34 respectively, thus placing all surfaces of patterned structural layer 32 in contact with a PSG layer and dopant source.

Figure 6:
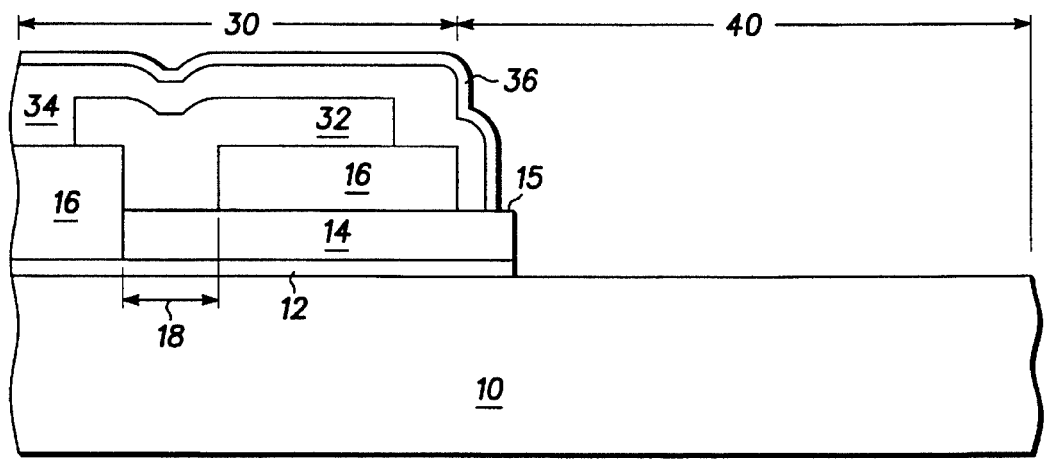

Referring again to FIG. 2, step 140 provides first for depositing and patterning sealing layer 36 to provide protection for sensor area 30 during fabrication of circuit elements within IC area 40. It will be understood that while the disclosed method essentially defines all SMS structures in layer 32, these sensor structural elements 32 within sensor area 30 are encased between, and protected by, first and second sacrificial layers, 16 and 34 respectively. Thus while IC device elements, such as source/drain regions 42 shown in FIG. 1, are formed utilizing high temperature processing, sensor structural elements 32 will remain protected from stress accumulation and damage caused by the high temperatures utilized in IC processing. Additional protection for sensor area 30 and SMS structures therein during IC processing is further provided by sealing layer 36. Referring now to FIG. 6, sealing layer 36, typically comprised of $Si_3N_4$, is shown patterned to expose substrate 10 in IC area 40 while essentially forming a seal for sensor area 30, leaving interconnect area 15 and IC area 40 unsealed.

Figure 7:
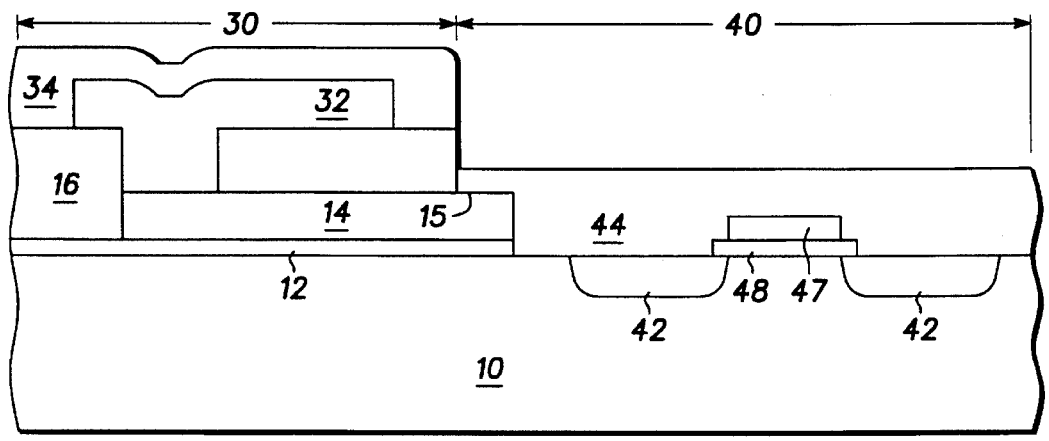

Step 140, see FIG. 2, additionally provides for forming circuitry within IC area 40. It will be understood that the specific process steps employed are dependent upon the desired final structure and functionality of the IC circuitry so formed. It is also understood that such process steps are intended to be utilized in the present invention. Referring now to FIG. 7, essentially all IC circuit elements, such as source/drain regions 42 are formed and illustrated underlying oxide layer 44. It has been found that a rapid thermal anneal (RTA), tailored for the specific IC processing employed can effectively relieve stresses created in patterned structural layer 32 during IC processing when performed while sensor layer 32 remains encased between first and second sacrificial layers 16 and 34 respectively. Thus for a typical MOS process, a RTA at approximately 900° C. for approximately 30 seconds has proven effective. It will be understood, that different RTA conditions can be required and are a function of the type of sensor elements fabricated as well as the specific IC processing steps performed. It will be further understood that these different RTA conditions can be readily determined empirically through the evaluation of test structures. Finally, it will be understood that seal layer 36 can be removed before or after the thermal anneal. FIG. 7 illustrates the structure fabricated by an embodiment of the method of the present invention at the completion of step 140 where seal layer 36 has been removed prior to the RTA.

Figure 8:
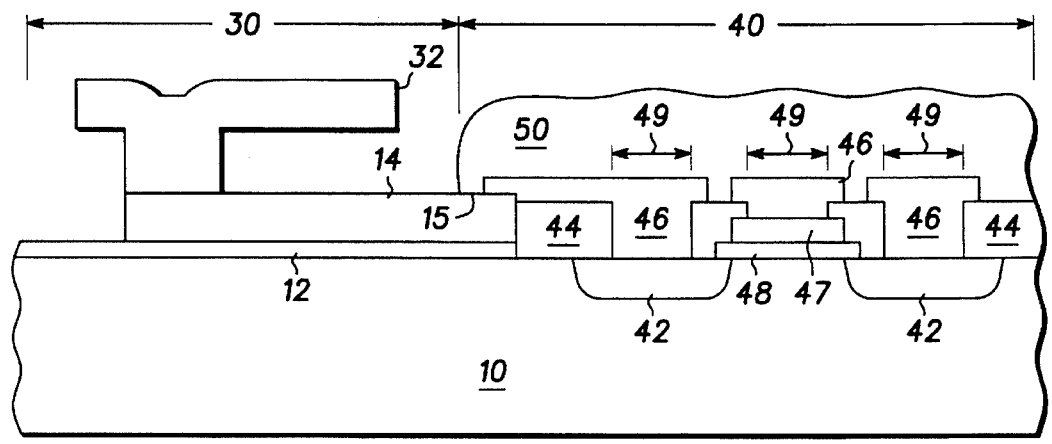

Referring again to FIG. 2, step 150 provides that sensor area 30 is electrically coupled to IC area 40 using interconnect area 15. As illustrated in FIG. 8, contact openings 49 have been formed in oxide layer 44. Metal contact layer 46 has been deposited and patterned to form metal contacts 46, thus both electrically coupling sensor area 30 to IC area 40, and providing for electrical coupling to various IC circuit elements as shown. Step 150 subsequently provides for deposition and patterning of passivation layer 50. Patterning of passivation layer 50 will expose sensor area 30 and expose bonding areas (not shown) within IC area 40 for off chip electrical coupling. It will be understood that passivation layer 50 will typically comprise $Si_3N_4$, at least as the uppermost layer. Selection of $Si_3N_4$, or any other dielectric material with a high selectivity to PSG, is important to fully protect IC area 40 during subsequent removal of the sacrificial layers. Finally, first and second sacrificial layers, 16 and 34 respectively, are etched to free patterned structural layer 32. Typically, the sacrificial layers are etched using a BOE solution which helps provide the selectivity to structural elements 32 and passivation layer 50 as well as any exposed metal layers. FIG. 8 illustrates the structure fabricated by an embodiment of the method of the present invention at the completion of step 150.

Thus, a new method has been disclosed for fabricating a monolithic semiconductor device with integrated surface micromachined structures. The method provides for essentially forming all structures within sensor area 30, prior to forming IC device elements within IC area 40. The method additionally provides for protecting all sensor structural elements 32 from the effects of thermal processing by first encasing them within first and second sacrificial layers, 16 and 34 respectively. Second, providing seal layer 36 overlying sensor area 30 to completely seal sensor area 30 within seal layer 36. And, finally to provide a tailored RTA process to relieve any stresses accumulated by elements 32 during an optimized IC process. In addition, the method provides for sensor elements within sensor area 30 and IC elements within IC area 40 to be of any type, as processing of each area is independent from the other.

It will be understood that the method provided offers substantial advantages over prior art methods in providing independent optimization of sensor elements and IC elements. As one skilled in the art knows, optimization of fabrication processes results in devices having improved reliability and lower cost. In addition, optimization also provides for better compensation side effects, both through the reduction in side effects themselves, and by fabrication of higher performance, optimized devices. Finally, such optimized devices provide for improved data acquisition though the optimization of both sensor and IC functionality.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A method of manufacturing a monolithic semiconductor device with an integrated surface micromachined structure comprising the steps of:

providing a semiconductor substrate;

forming at least one conductive microstructure, wherein the at least one conductive microstructure overlies said semiconductor substrate within a sensor area, wherein said at least one conductive microstructure is sealed;

forming at least one semiconductor device subsequent to the step of forming said at least one conductive microstructure, wherein said at least one semiconductor device, including conductively doped regions, is formed within an integrated circuit area;

performing a thermal anneal subsequent to the forming of said at least one semiconductor device;

unsealing said at least one conductive microstructure, wherein said at least one conductive microstructure is suspended; and electrically coupling said at least one conductive microstructure to said at least one semiconductor device.

2. The method of claim 1, wherein the step of providing a semiconductor substrate comprises providing a semiconductor substrate comprising a layer of epitaxial silicon overlying a semiconductor wafer.

3. The method of claim 1, wherein the step of forming at least one conductive microstructure further comprises the prior steps of:

forming an interconnection layer overlying said semiconductor substrate;

forming a first sacrificial layer overlying said interconnection layer, wherein said first sacrificial layer further comprises phosphorus doped silicon dioxide;

forming a structural layer overlying said first sacrificial layer;

forming a second sacrificial layer overlying said structural layer, wherein said second sacrificial layer further comprises phosphorus doped silicon dioxide; and forming a sealing layer overlying said second sacrificial layer, wherein said sealing layer comprises silicon nitride.

4. The method of claim 3, wherein the step of forming an interconnection layer further comprises forming a material selected from the group of polysilicon, refractory metal silicide and refractory metal salicide.

5. The method of claim 3, wherein the step of forming at least one conductive microstructure further comprises physically and electrically coupling said at least one conductive microstructure to said interconnection layer.

6. The method of claim 5, wherein physically and electrically coupling said at least one conductive microstructure to said interconnection layer further comprises forming anchor openings in said first sacrificial layer.

7. The method of claim 3, wherein the step of forming at least one conductive microstructure further comprises a step of forming an insulating layer underlying said interconnection layer.

8. The method of claim 7, wherein the step of forming said insulating layer comprises forming an insulating layer comprised of silicon nitride, or silicon nitride overlying silicon dioxide.

9. The method of claim 3, wherein the step of forming at least one conductive microstructure further comprises removing said first and second sacrificial layers subsequent to the step of forming at least one semiconductor device.

10. The method of claim 9, wherein the step of forming at least one conductive microstructure comprising removing said first and second sacrificial layers subsequent to the step of forming at least one semiconductor device further comprises depositing and patterning a passivation layer overlying said IC area.

11. The method of claim 3, wherein the step of forming at least one conductive microstructure comprises forming at least one conductive microstructure selected from the group consisting polysilicon and tungsten.

12. A method of fabricating a monolithic semiconductor device with integrated surface micromachined sensor structures comprising the steps of:

providing a semiconductor substrate having a top surface;

forming an interconnection layer overlying said top surface;

forming a first sacrificial layer overlying said interconnection layer;

patterning said first sacrificial layer, wherein an integrated circuit area and a sensor area are defined and wherein selected portions of said first sacrificial layer are removed in said sensor area to form at least one anchor opening exposing said interconnection layer;

forming a structural layer, wherein said structural layer overlies said first sacrificial layer and couples to said interconnection layer through said at least one anchor opening;

patterning said structural layer to form at least one sensor structural element within said sensor area;

forming a second sacrificial layer overlying said sensor area;

forming a sealing layer overlying said sensor area;

then forming semiconductor device structures, including conductively doped regions, within said integrated circuit area;

performing a rapid thermal anneal;

forming a passivation layer overlying said IC area;

removing said sealing layer, first sacrificial layer and said second sacrificial layer, wherein said at least one sensor structural element is suspended; and electrically coupling said at least one sensor structural element and said semiconductor device structures.

13. The method of claim 12, wherein the step of providing a semiconductor substrate comprises providing a semiconductor substrate comprising a layer of epitaxial silicon overlying a semiconductor wafer.

14. The method of claim 12, further comprising the step of forming an insulating layer, wherein said interconnection layer overlies said insulating layer.

15. The method of claim 14, wherein the step of forming an insulating layer comprises forming a silicon nitride insulating layer.

16. The method of claim 12, wherein the step of forming a passivation layer comprises forming a passivation layer comprising silicon nitride.

17. The method of claim 12, wherein the step of forming a structural layer comprises forming a polysilicon structural layer.

18. The method of claim 17, further comprising the step of doping said layer of polysilicon with phosphorous.

19. The method of claim 12, wherein the step of forming a structural layer comprises forming a tungsten structural layer.

20. The method of claim 12, wherein the step of forming a second sacrificial layer further comprises forming a phosphorus doped silicon dioxide second sacrificial layer.

21. The method of claim 11, wherein the step of patterning said structural layer to form at least one sensor structural element comprises forming a microstructure disposed above and electrically coupled to said interconnection layer.

* * * * *